United States Patent [19]
Bohlke et al.

[11] Patent Number: 5,830,376
[45] Date of Patent: Nov. 3, 1998

[54] TOPOGRAPHICAL SELECTIVE PATTERNS

[75] Inventors: Susan Nord Bohlke, Woodbury; Gregory M. Jellum, Stillwater; Douglas S. Dunn, Maplewood; Andrew J. Ouderkirk, Woodbury, all of Minn.

[73] Assignee: Minnesota Mining and Manufacturing Company, St. Paul, Minn.

[21] Appl. No.: 754,468

[22] Filed: Nov. 22, 1996

Related U.S. Application Data

[63] Continuation of Ser. No. 914,981, Jul. 16, 1992, abandoned.

[51] Int. Cl.$^6$ ........................................................ B05D 3/00
[52] U.S. Cl. .............................. 216/65; 216/66; 216/67; 216/94; 156/345 LT; 156/345 B; 156/345 P; 427/533; 427/537; 427/536; 427/555; 438/694; 438/710; 438/712; 438/733
[58] Field of Search .................................. 427/526, 533, 427/534, 536, 537, 597, 555, 557, 558, 556, 535; 204/192.15, 192.31; 216/65, 66, 67, 94; 156/633.1, 634.1, 643.1, 655.1, 656.1, 345 LT, 345 BR, 345 PR; 219/121.35, 121.41, 121.59, 121.69, 121.85; 438/708, 694, 700, 733, 710, 712

[56] References Cited

U.S. PATENT DOCUMENTS

| | | | |
|---|---|---|---|
| 3,860,783 | 1/1975 | Schmidt et al. | 219/121 EM |
| 3,873,371 | 3/1975 | Wolf | 427/526 |
| 3,904,462 | 9/1975 | Dimigen et al. | 156/13 |
| 4,016,062 | 4/1977 | Mehta et al. | 204/192 E |
| 4,097,618 | 6/1978 | Poliniak | 427/534 |
| 4,126,712 | 11/1978 | Poliniak et al. | 427/534 |
| 4,289,381 | 9/1981 | Garvin et al. | 427/555 |
| 4,388,517 | 6/1983 | Schulte et al. | 427/555 |
| 4,414,059 | 11/1983 | Blum et al. | 156/659 |
| 4,465,551 | 8/1984 | Horwitz | 427/534 |
| 4,684,437 | 8/1987 | Donelon et al. | 156/643 |
| 4,756,793 | 7/1988 | Peek | 427/526 |
| 4,761,394 | 8/1988 | Conrad | 427/38 |
| 4,764,394 | 8/1988 | Conrad | 427/38 |
| 4,822,451 | 4/1989 | Ouderkirk et al. | 156/643 |
| 4,863,549 | 9/1989 | Grünwald | 156/643 |
| 4,891,118 | 1/1990 | Ooiwa et al. | 156/643 |
| 4,918,031 | 4/1990 | Flamm et al. | 156/643 |
| 5,091,626 | 2/1992 | Lewis et al. | 219/121.69 |
| 5,139,967 | 8/1992 | Sandhu et al. | 437/173 |
| 5,145,555 | 9/1992 | Yamamoto | 216/66 |
| 5,264,383 | 11/1993 | Young | 437/40 |
| 5,350,499 | 9/1994 | Shibaike et al. | 216/66 |

FOREIGN PATENT DOCUMENTS

| | | | |
|---|---|---|---|
| 0 502 632 | 9/1992 | European Pat. Off. | G03F 7/004 |
| 1170558 | 8/1986 | Japan | 427/534 |

OTHER PUBLICATIONS

"Comparative Status of Pulsed Ion Implantation", J. Gyulai and I. Krafcsik, 1989 No Month.

"Patterning Techniques for Roll Coated Films", R. W. Phillips, D. Todd, and T. Markantes, 1989 No Month.

"Excimer Laser Thin Metallic Film Patterning On Polyvinyledene Difluoride", M. Gauthier, R. Bourret et al., Mat. Res. Soc. Symp. Proc., vol. 129, 1989 No Month.

Database Inspec, Institue of Electrical Engineers, Stevenage, GB Inspec. No. 1390211, H. Gokan et al., Pattern Fabrication by Oblique Incedent Ion–Beam Etching, abstract. No Date.

*Materials Research Society Symposium Proceedings*, vol. 129, 1989, Pittsburgh, U.S., pp. 399–404, M. Gauthier et al., Excimer Laser Thin Metallic Film Patterning on Polyvinyledene Difluoride. No Month.

Database Inspec, Institute of Electrical Engineers, Stevenage, GB Inspec. No. 1390211, H. Gokan et al., Pattern Fabrication by Oblique Incedent Ion–Beam Etching, abstract. No. Date.

"Comparative Status of Plused Ion Implantation", J. Gyulai and I. Krafcsik, 1989 pp. 275–279, Nuclear Instruments & Methods in Physics Research, B37/38 No Month.

"Excimer Laser Thin Film Patterning On Polyvinyledene Difluoride", M. Gauthier, R. Bourret et al., Mat. Res. Soc. Symp. Proc., vol. 129, 1989 No Month.

*Primary Examiner*—Marianne Padgett
*Attorney, Agent, or Firm*—John A. Burtis

[57] ABSTRACT

A maskless process generates a patterned coating on a polymeric substrate, wherein the pattern is at least partially defined by the substrate topography. The process uses a high intensity/high fluence energy source to strike a coated substrate, thus selectively removing a portion of the coating. The amount and area of the coating removed is dependent on the substrate topography and the applied energy, and this forms a pattern of residual coating material on the substrate.

15 Claims, No Drawings

TOPOGRAPHICAL SELECTIVE PATTERNS

This is a continuation of application Ser. No. 07/914,981 filed Jul. 16, 1992 now abandoned.

BACKGROUND OF THE INVENTION

It is well known to produce patterns in coatings on objects by wiping, abrading, transfer tape etc. Patterning results from selective removal of the coating on the tops of features on the object, leaving coating material in the recesses. Such patterning is found in household equipment and curios, signs, badges, and the like.

Another common patterning method uses photolithographic techniques with masks and photoresists. This patterning is generally performed on flat surfaces.

Surface modification processes are common. For example, e-beam, corona, and plasma treatment have been used to increase the adhesion of coatings to surfaces, to etch materials, and to change the chemistry of a surface. These methods, as well as ion implantation, are either continuous or long pulse length processes. Their low energy flux results in a low heat transfer rate, and as such they are not appropriate for surface modification as exemplified by the present invention. The method of the present invention is an advance over these earlier processes of surface modification because its use of a short pulse length, high fluence, and high intensity allows a thin surface treatment of a material and does not affect the bulk physical or chemical properties of the substrate.

Ion implantation has been used for some time to modify the surface properties of various materials such as metals, polymers, and coatings. The use of directed energetic ion beams to improve adhesion, create texture, enhance wear or scratch resistance, make polymers conductive, and increase optical transmission has been reported.

"Comparative Status of Pulsed Ion Implantation", J. Gyulai and I. Krafcsik, Nuclear Instruments and Methods in Physics Research B37/38 (1989) pp 275–279 describes an experimental exploration of the effects of pulsed ions on doping and annealing of materials. Metals, ceramics and organics are considered as targets for the pulsed ions. Generally at least one thousand pulses were used and the study used primarily boron ions. The work is primarily performed on metal surfaces and semiconductive surfaces, although organic surfaces (including Hostafan, polyethylene terephthalate) are generally described.

U.S. Pat. No. 4,822,451 (Ouderkirk et al) teaches a process for the surface modification of semi-crystalline polymers wherein said polymers can have predetermined amounts of their surfaces rendered quasi-amorphous by irradiation with high energy pulses, such as for example an excimer laser.

U.S. Pat. No. 4,414,059 (Blum et al) discloses a technique for the manufacture of micro-electronic devices by ablative photo-decomposition of lithography resists using lasers. There are many references to laser photoablation of various polymers including poly(ethylene terephthalate), poly (methyl methacrylate), polyimide, etc.

"Patterning Techniques for Roll Coated Films", R. Phillips et al, Proc. Annual Tech. Conf. Soc. Vacuum Coaters, 32nd, (1989) pp. 175–186 discusses patterning through a mask of deposited metals and oxides on polymeric webs using an excimer laser.

"Excimer Laser Thin Metallic Film Patterning on Polyvinyledene Difluoride", M. Gauthier et al, Mat. Res. Soc. Symp. Proc., Vol. 129 (1989) pp 399–404 describes metal ablation from polyvinyledene difluoride by projecting and scanning an excimer laser on the metal surface.

U.S. Pat. No. 4,684,437 (Donelon et al) discloses a differential material removal process wherein a selected material can be rapidly removed without adverse impact to surrounding layers of different materials using, for example, an excimer laser. This process can remove metals embedded on the surface of a polymer layer.

U.S. Ser. No. 07/665,692 (Ouderkirk et al) teaches a process for directing pulses of plasma or ions or a scanned beam of plasma or ions including a plasma of high intensity, high fluence ions and charged and neutral particles, to impact a thin surface layer of an object, to thus alter the chemistry, crystal morphology, topography, or density of said surface layer. The process may employ plasma generated from a gas, liquid, or solid source such as, for example, from a coaxial plasma gun. That application teaches that inorganic coatings on polymers can be etched away using either a contacting or non-contacting mask, leaving desirable patterns or printing.

DESCRIPTION OF THE INVENTION

The present invention is a maskless process for producing a patterned coating on a polymeric or ceramic substrate, wherein the pattern is defined by the substrate topography. The invention uses a high intensity/high fluence energy source to strike the substrate, thus selectively removing a portion of the coating. The removal is dependent on the substrate topography and the applied energy, and forms a pattern of residual coating material on the substrate. The remaining coating can be purposely produced on surfaces that are angled away from the energy source and/or recessed from the top most plane of the topographical feature.

The topography of the coated surface is the preferred pattern defining element in this invention. An appropriate energy level source at a selected energy is used to produce a desired pattern in the coating. Various topographies have been investigated. Examples include substrates with indentations or grooves of various shape and dimension, such as for example, rectangular, saw-toothed, V-shaped grooves, and canted or asymmetric variations of these shapes as well as irregularly shaped indentations.

It has been found that with, for example, a metallized grooved polymeric substrate, the process of the present invention can remove the metallization from the tops of the grooves, but still leave the metallization on slanted or recessed surfaces. If the polymeric substrate has rectangular grooves, the metallization can be removed from the tops of the grooves, or both the tops and bottoms of the grooves, while still leaving the metallization on the side faces.

There are two necessary conditions required of the energy source to provide the treatment of the present invention. Both high intensity (high power per unit area) and high energy density are required. These requirements assure that a substantial amount of heat generated in the very thin surface coating in a very short time, stays in the surface during the short increments of the process, often referred to as a pulse. The effect of these requirements is to concentrate energy into the surface layer. Thermal diffusion, from the thin treatment layer into the bulk beneath the surface, reduces this concentration of energy and makes the process less efficient. It is, therefore, required that only a small amount of heat be dissipated into the bulk material during treatment. The more heat that is transferred to the bulk during surface treatment, the less efficient the process becomes. Too much heat may go into the bulk so that the process would no longer work. Because of this limitation, most non-pulsed or long pulse length energy sources such as flame treatment, low to moderate intensity ion implantation, conventional UV lights, corona treaters, sputtering and vapor deposition apparatus, and the like will not work.

The UV excimer laser and specially produced UV flash lamps as described in U.S. Pat. No. 4,822,451 (Ouderkirk et al.) are light sources capable of producing the required high intensity, high fluence radiation on the surface of the substrate to be treated required in the present invention. The UV excimer laser, because of its relative low cost, is one of the preferred energy sources useful in this invention.

Ion beam accelerators, magnetically insulated ion diodes, and magnetically assisted plasma shock generators as described in U.S. Ser. No. 665,692 are also energy sources which can be used in the practice of this invention.

The coaxial plasma gun described in U.S. Ser. No. 665, 692 is one of the instruments of choice in the present invention and is capable of producing the short pulse width, high intensity, high energy density required for this process. The effective pulse width of the plasma should be in the range of 10 nanoseconds to either 1 millisecond or 100 microseconds to assure rapid thermal excitation of the affected surface layer. The intensity of the plasma source should be over 10,000 watts/cm$^2$, or preferably over 100,000 watts/cm$^2$. The energy density of the plasma must be in the range of 10 mJ/cm$^2$ to 1,000 J/cm$^2$ with the lower energy densities achieved by increasing the distance between the gun and the material to be treated or by reducing the gun discharge energy.

An "effective pulse" can be generated by scanning with a focused beam. By controlling the dwell time of the beam on a given area, the effect of the beam may be the same as a pulse within the fluence range required in the present invention. Repeated effective pulses may be generated on an area by repeated scanning of that area. For many treatments 1 to 10 or even 1 to 100 effective pulses may be necessary to completely ablate the desired coated areas.

The normal application of the coaxial plasma gun for the processes described in this invention requires operation in a vacuum or at a pressure of less than $10^{-1}$ torr. If the stored energy of the plasma gun is electronically switched or triggered, then pressures up to 600 torr may be used. These same pressures may be achieved by using the breakdown characteristics of an appropriately chosen gas mixture.

The substrates with the coating to be patterned by the process of the present invention can be virtually any material. The substrate must define at least a portion of the desired pattern by its topography, however.

The material for use as the coating can be any inorganic material, and should be in the form of a thin film coating of no more than 10 microns thick (10 microns or less). Thicker coatings can be removed by using energy sources of higher intensity and fluence or by using multiple pulses. Different energy sources as well as different designs of those sources, such as plasma accelerators and ion diodes, will have differing coating thickness limitations. The coatings may be metals, metal oxides, non-metallic elements, alloys, compounds and the like. The coatings may also comprise two or more layers of inorganic material. In addition, the two or more layers may comprise layers of metal and metal oxide.

The following theoretical criteria have been developed for assistance in understanding the practice of the present invention. An angle Θ will be defined to be the angle that the surface of the topographical feature makes with the energy beam. The width (W) of the feature is further defined as the minimum width between two vertical features (that is, features which have a vertical component) or openings (e.g., grooves) of the top plane (or point) of the surface closest to the energy source. The depth (D) of a feature is further defined as the distance from the plane at where W is defined to an adjacent surface or point which is furthest from the plane at which W is defined and where the coating is to be removed.

The mean free path (MFP) of an ion source will be defined as the average distance between molecular collisions near the treated substrate, that is:

$$MFP = \frac{1}{\sigma n}$$

where (σ) sigma equals the collisional cross section of the particle and n=number of molecules per unit volume. With these definitions, a pattern will be produced in the coating on the topographically defining substrate under either of the following two conditions:

1) If Θ is less than a present practical limit of facile control of the energy source, about 30 degrees, the energy can be adjusted so that coating material will be left on the surface of the feature. In this case any of the previously mentioned energy sources will work.

2) If Θ is greater than 30 degrees, the energy can be adjusted to leave coating material on the surface of the feature if:

a) W/D<3 and
b) D/MFP>1

In this case, plasma energy sources are preferred.

Coaxial Plasma Gun

Coaxial plasma guns and railguns are well described in the literature such as:

Methods of Experimental Physics. Vol. 9 - Part A, 1970, Academic Press

Descriptions of electromagnetically driven shock tubes

"Nitrogen Implantation of AISI 304 Stainless Steel with a Coaxial Plasma Gun," J. N. Feugeas et al., J. Appl. Phys., Vol. 64 (5), 1 Sep., 1988, pp. 2648–2651

Demonstrated ion implantation for improved hardness of steel.

"Deposition of Wurtzite Type BN Layers by Reactive Pulse Plasma Crystallization," M. Sokolowski, J. of Crystal Growth, Vol. 46 (1979), pp. 136–138

One of a series of papers by this group on growing crystaline thin films of diamond, BN, and $Al_2O_3$ on substrates by either using the electrodes as a source, gas phase chemistry, or modification of a thin film on a substrate.

High density plasmas can interact with the raised portions of topographic features to shield surrounding areas that are lower than the raised features. Even though these surrounding areas are within line of sight of the energy source and at an angle theta greater than 30 degrees, the raised portions attenuate the received energy density sufficiently to prevent removal of the coating. This effect is particularly noticeable with a coaxial plasma source and with lower energy densities.

It can be seen that by knowing the geometry of the topographical features of the substrate, and picking a proper energy source and energy amount, the process of the present invention will produce a pattern in the coating on the treated substrate.

The discontinuous coating on the topographic surface produced by the practice of the present invention has observable features that can visually distinguish that coating from materials produced by prior art methods. One distinctive feature is that the observed coating has topographic features, the discontinuities in the coating bearing an observable orientation with respect to the features, and the edges of the coatings where the edges contact uncoated areas have beads, curled areas, thickened portions, or the like. These edge features on the coating are present at much of the edge, if not all of the edge. One theory for the presence of these edge features is that the energy projected against and absorbed by the surface metals the coating (particularly if it is a metal) at the border of the ablated and non-ablated areas, and the surface tension of the molten coating causes the coating to retract at the edge and form a bead or thickened area.

EXAMPLES

The majority of examples to follow use either the UV excimer laser or the puffed accelerated coaxial plasma gun as the energy source, with stationary samples. However, it will be recognized by those skilled in the art that other appropriate energy sources can be used and that continuous treatment of material by advancement of the material through a targeted area is also possible. The energy source would be operated in a repeat pulse mode or continuously while the sample to be treated would be moved either step-wise or continuously into the path of the energy pulses. The timing of the system would be varied so that any area of sample can receive one or more pulses. Wide widths could be treated by using energy sources of larger dimensions or multiple sources in parallel or series.

The following test procedures were used in all of the examples unless otherwise specified.

Plasma power measurement: The front of a Gentec ED-550 pyroelectric calorimeter was masked to a 0.23 $cm^2$ aperture using razor blades. This power meter was placed at the center line of the travel path of the plasma, 79 cm from the muzzle of the gun. The energy of the plasma accelerator's 100 microfarad capacitor was changed by the charge voltage. Energy measurements averaged over 10 pulses were 0.078, 0.175, 0.332, 0.460, 0.55, 0.67, 0.78, 0.90, and 1.02 $J/cm^2$ at capacitor voltages of 3, 3.5, 4, 4.5, 5, 5.5, 6, 6.5, and 7 kV respectively. This calibration curve was then used to calculate the plasma energy striking the samples being treated. The pulse width of the plasma striking the sample was nominally about one microsecond.

Film thickness was measured using an Ono Sokki Co. Ltd. model EG-225 gauge.

Coaxial Plasma Gun Examples

Coaxial plasma guns and railguns are well described in the literature such as:
Methods of Experimental Physics. Vol. 9 - Part A, 1970, Academic Press
Descriptions of electromagnetically driven shock tubes.
"Nitrogen Implantation of AISI 304 Stainless Steel with a Coaxial Plasma Gun," J. N. Feugeas et al., J. .Appl. Phys., Vol. 64 (5), 1 Sep., 1988, pp. 2648–2651
Demonstrated ion implantation for improved hardness of steel.
"Deposition of Wurtzite Type BN Layers by Reactive Pulse Plasma Crystallization," M. Sokolowski, J. of Crystal Growth, Vol. 46 (1979), pp. 136–138
One of a series of papers by this group on growing crystalline thin films of diamond, BN, and $Al_2O_3$ on substrates by either using the electrodes as a source, gas phase chemistry, or modification of a thin film on a substrate.

The coaxial plasma gun is the instrument of choice in the present invention and is capable of producing the short pulse width, high intensity, high energy density required for this process. The effective pulse width of the plasma should be in the range of 10 nanoseconds to either 1 millisecond or 100 microseconds to assure rapid thermal excitation of the affected surface layer. The efficiency of the process can be increased by pre-heating the surface to be treated. The intensity of the plasma source should be over 1000 watts/$cm^2$, or better over 100,000 watts/$cm^2$. The energy density of the plasma must be in the range of 1 $mJ/cm^2$ to 1,000 $J/cm^2$ with the lower energy densities achieved by increasing the distance between the gun and the material to be treated or by reducing the gun discharge energy.

An "effective pulse" can be generated by scanning with a focused beam. By controlling the dwell time of the beam on a given area, the effect of the beam may be the same as a pulse of the fluence range required in the present invention. Repeated effective pulses may be generated on an area by repeated scanning of that area. For many treatments 1 to 5 effective pulses are sufficient, 1 to 10 or 1 to 20 effective pulses may be needed in other treatments and for ablation, 1 to 500 or even 1 to 1000 effective pulses may be necessary.

The coaxial plasma puff gun preferred in the practice of the present invention is conventional in both the electrical and mechanical layout and similar to the one described in A. Feugeas, et al., "Nitrogen Implantation of AISI 304 Stainless Steel with a Coaxial Plasma Gun," J. Appl. Phys. 64, (5), September, 1988, p. 2648. The power to the gun of this invention is provided from a bank of three parallel 33 uF, 10 kV, 20 nH capacitors. These capacitors are connected to the breech of the gun with a parallel plate bus. The gun itself consists of a 1 inch (2.5 cm) diameter copper rod in the center of a 2 inch (5.1 cm), 1/16 inch (0.159 cm) wall copper tube. The two electrodes have equal length of 6 inches (15.24 cm). The gun acts as both the high voltage switch and the accelerator. The process is initiated with a pulse of gas from an electrically driven automotive fuel injector. The gas is provided with a back pressure to the valve of between 20 and 300 psi, and the valve is set to a pulse width of between 0.2 and 10 ms. The longer pulse width is required to initiate discharge at lower capacitor voltages. The gun operates at a background pressure of less than 1 mTorr, typically $2 \times 10^{-4}$ Torr. Generally the pulsing apparati operate at less than 0.8 Torr, less than 0.4 bar, and often less than 0.05 bar. The gas pulse is radially distributed by a PTFE disk behind a flange supporting the outer electrode, fills the gap between the two electrodes at the breech of the gun, is ionized by the high field between the electrodes, and begins to discharge the capacitor. The current flowing from the capacitor through the electrodes and the plasma, electromagnetically accelerates the plasma down the barrel formed by the coaxial electrodes. The nominal 1 microsecond duration, 500–1000 J of energy, plasma pulse, leaves the gun at a velocity of about 100,000 m/s, spreads out in an approximate 30° cone with a near Gaussian radial energy profile, and strikes the surface of the material being treated. The plasma transfers energy to the surface, quickly raising the surface temperature, and initiates a range of effects depending on its intensity and energy density. This plasma can originate from solid, liquid, or gaseous material and may be either inert or chemically reactive, depending on the material used to start the plasma discharge as described above. When the accelerated plasma strikes a material, the surface simultaneously experiences high temperatures (>10000 K.) and pressures (>10 atmospheres) for several microseconds. This process creates unique structural and or chemical changes in the exposed surface.

The normal application of the coaxial plasma gun for the processes described in this invention requires operation in a vacuum at a pressure of less than $10^{-2}$ torr. If the capacitor is electronically switched or triggered, then pressures up to 600 torr (about 0.8 bar) may be used.

Example 1

A piece of 10 mil (0.25 mm) polycarbonate (GE Lexan 8040) was scribed using a standard razor blade and an Exacto brand knife into a crude grid pattern. The alternating cuts were spaced approximately ¼ inch (0.6 cm) apart and had depths of approximately 25 microns. A copper (Cu) film was then e-beam evaporated to a thickness of 100 nm on the substrate. The metallized sample was exposed to one accelerated argon (Ar) pulse at an energy density of 3.4 J/cm². The treatment demetallized the Cu from the polycarbonate substrate. Observation under an optical microscope (50x) confirmed Cu metal remained in the scribed grooves.

Example 2

An 80–100 nm aluminum film was electron beam evaporated onto an embossed PETG (glycol modified polyethylene terephthalate) film. The sample had a thermally embossed pattern of symmetrically spaced, parallel channels which looked like gear teeth when viewed in cross section. The groove depths were 15 mils (0.38 mm) with the center to center spacing at 10 mils (0.25 mm). The side walls were slanted at 6 degrees from perpendicular to the top normal plane. Both the top and bottom surfaces were normal to the plasma source and nearly equivalent in area. The sample was treated to one accelerated argon plasma pulse with an energy density of 0.7 J/cm². Examination of the sample under an optical microscope at a magnification of 30x showed the removal of the metal coating from the top normal plane. SEM micrographs of the sample taken while in the X-ray analysis mode (EDAX) confirmed the selective removal of the metal from the top surfaces while it remained on the side and bottom surfaces of the groove pattern.

Examples 3–4

Pieces of 10 mil (0.25 mm) polyethylene film (Consolidated Thermoplastics) were thermally embossed against a flex circuit to form replicates of the circuit pattern. The flex circuit was from a Hewlett Packard ink print cartridge, HP 51608A. The depth of the embossed pattern corresponded to the 1.4 mil (0.036 mm) thickness of the copper circuit. The smallest groove feature of the pattern had a width of 3 mil (0.076 mm) with a center to center spacing (pitch) of 6 mil (0.15 mm). The samples were metallized with 100 nm of e-beam evaporated copper. The metallized parts were each treated to one accelerated helium plasma pulse. The following table summarizes the results as observed under an optical microscope (50x).

| energy density (J/cm²) | Demetallization |
| --- | --- |
| 0.6 | metal intact on bottom and side walls of grooves; also in some of the circuit pad regions |
| 1.1 | metal only observed on groove side walls |

Example 5

Samples of a linear grooved acrylic film were metallized with 130–150 nm of e-beam evaporated copper. The grooves were formed by casting and curing a UV-curable resin against a metal tooling onto a polycarbonate (GE Lexan) backing. The groove dimensions were measured from an optical micrograph (50x) of the cross section. The parallel grooves had a depth of approximately 380 microns with the top (or peak) width and corresponding space of 95 microns. The groove bottoms were 10 microns in width. A sample was treated with one accelerated argon plasma pulse having an energy density of 1.8 J/cm². Optical micrographs (50x) confirmed the selective removal of the metal coating from the groove tops.

Example 6

A radially grooved acrylic film formed in a similar fashion to Example 5, was coated with 130 to 150 nm of E-beam evaporated silicon. The grooves were a canted sawtooth structure with one surface tapering 6 degrees from the surface normal. The groove depth was 0.38 mm with a 0.63 mm spacing between the grooves. The sample was treated with 1 accelerated argon plasma pulse at an energy density of 1.5 J/cm². Optical microscopy indicated that the thin film coating was cleanly removed from the slanted surface but left remaining on the near vertical surface of the grooves.

Example 7

Pieces of polyetherimide (Ultem TM 2212) were injection molded to contain 1.83 mm deep grooves with 0.56 mm wide horizontal land areas and a 2.4° taper angle, with respect to the surface normal, then coated with a palladium seed layer (<10 nm), which was followed by 100 nm of electroless copper. The sample was then treated to 1 accelerated helium plasma pulse at an energy density of 1.8 J/cm². Optical microscopy confirmed the presence of copper on the groove walls and bottom surface but not on the top surface.

Excimer Laser Examples

Examples 8–10

Polyetherimide samples as in Example 7 were coated with 60, 100, and 200 nm thick layers of electroless copper on top of a palladium seed coat and exposed to 1 pulse from a Lambda Physik LPX Model 315i excimer laser operating at 248 nm wavelength. The energy density of the laser pulses was varied over the range of 120 to 250 mJ/cm², as measured through a 0.14 cm² aperture with a Gentec joulemeter. Optical microscopy of the treated parts showed that there had been removal of the copper from the horizontal faces of the grooves. The samples were then coated with an approximately 0.0254 mm thick layer of electroplated copper. Electrical measurements using a digital voltmeter along the groove walls, where the metal layer remained in place, showed that the metal lines had resistances between 0.03 and 0.05 ohms, indicating high integrity of the coating. Between groove walls, the resistances were greater than 20 million ohms, indicating complete removal of the metal on the horizontal tops and bottoms of the grooves.

Example 11

A piece of an acrylic material on a polyethlyene terephthalate backing was cast and cured against a nickel tool to produce a groove pattern in the acrylic layer 0.03 mm deep which consisted of 0.10 mm wide groove tops, 0.076 mm wide groove bottoms, and a 7.5° taper angle with respect to the surface normal. This sample was coated with an approximately 100 nm thick layer of electron beam evaporated aluminum followed by an approximately 20 nm thick layer of aluminum reactively evaporated in an oxygen-containing ambient environment. This second layer provided an ultraviolet absorbing surface on the sample. The coated sample was then exposed to 1 pulse from a Lambda Physik LPX excimer laser operating at 248 nm wavelength, and a pulse energy density of approximately 100 mJ/cm². Optical microscopy and energy dispersive X-ray analysis (EDAX) indicated that the thin film coating was cleanly removed from the horizontal groove surfaces and remained intact on the groove walls.

Example 12

The acrylic material of Example 5 was coated with approximately 100 nm of E-beam evaporated copper. The sample was then exposed to 1 pulse from a Lamdba Physik LPX excimer laser operating at 248 nm wavelength, and a pulse energy density of approximately 100 mJ/cm². Optical microscopy and (EDAX) indicated that the copper layer was cleanly removed from the horizontal groove surfaces and remained intact on the groove walls.

We claim:

1. A process for generating a patterned, discontinuous coating on a surface of a substrate by removal of portions of a substantially continuous coating comprising the steps of:
   (a) providing the substrate with topographic features of height, width, and depth, the substrate comprising a bulk material having the substantially continuous coating thereon,
   (b) exposing substantially all of the surface of said continuous coating to a pulse of energy of sufficient fluence at an angle that can remove the continuous coating only where the pulse of energy is sufficiently absorbed by the continuous coating, and
   (c) controlling the angle at which the energy impacts against the continuous coating so that the topographic features prevent sufficient amount of the energy necessary to remove the continuous coating from striking some but not all areas of the continuous coating, the energy removing the continuous coating from areas on the surface where the energy strikes and is absorbed in sufficient energy density to remove the continuous coating from said areas exposed to sufficient energy density, and leaving the continuous coating on topographic features where the energy density absorbed was insufficient to remove the continuous coating due to interaction of the energy with topographic features, thereby creating the patterned, discontinuous coating on the surface.

2. The process according to claim 1 wherein the topographic features may be defined by a) the width (W) of surface features which is the minimum width between two adjacent surface features and b) the depth (D) measured as the distance from a top plane where W is defined to an adjacent surface of the substrate where the continuous coating is be to removed and the ratio of W/D is less than 3.

3. The process of claim 1 wherein the fluence of the energy directed against the surface is between 10 and 1,000,000 mJ/cm².

4. The process of claim 3 wherein the energy has a source which has a pulse width of between 10 ms and 1 ms.

5. The process of claim 1 wherein a plasma source is used as a source of the energy.

6. The process of claim 5 wherein the plasma source is a coaxial plasma gun.

7. The process of claim 5 wherein the plasma source has an intensity which is over 10,000 watts/cm².

8. The process of claim 1 wherein said bulk material comprises a polymer and said continuous coating comprises a continuous layer comprising a metal or other inorganic material.

9. The process of claim 8 wherein said continuous coating comprises a vapor deposited or sputtered layer.

10. The process of claim 8 wherein the topographic features comprise approximately parallel or concentric rows in the bulk material.

11. The process of claim 9 wherein the topographic features comprise approximately parallel or concentric rows in the bulk material.

12. Process of claim 1 wherein a laser is used as a source of the energy.

13. Process of claim 1 wherein a laser is used as a source of the energy where the laser is a rare gas/halogen excimer laser.

14. The process of claim 1 wherein the continuous coating comprises at least two layers of inorganic material.

15. The process of claim 14 wherein the two layers or more comprising layers of metal and of metal oxide.

* * * * *

UNITED STATES PATENT AND TRADEMARK OFFICE
CERTIFICATE OF CORRECTION

PATENT NO. : 5,830,376
DATED : November 3, 1998
INVENTOR(S) : Susan Nord Bohlke, Gregory M. Jellum, Douglas S. Dunn, and Andrew J. Ouderkirk It is certified that error appears in the above-identified patent and that said Letters Patent is hereby corrected as shown below:

Column 10,
Line 16, "10 ms" should read -- 10 ns --.

Signed and Sealed this

Thirtieth Day of October, 2001

Attest:

*Nicholas P. Godici*

Attesting Officer

NICHOLAS P. GODICI
*Acting Director of the United States Patent and Trademark Office*